(12) United States Patent
Watanabe et al.

(10) Patent No.: US 11,462,680 B2
(45) Date of Patent: Oct. 4, 2022

(54) MAGNETIC STORAGE DEVICE

(71) Applicant: Kioxia Corporation, Tokyo (JP)

(72) Inventors: Daisuke Watanabe, Yokkaichi Mie (JP); Toshihiko Nagase, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/181,087

(22) Filed: Feb. 22, 2021

(65) Prior Publication Data
US 2021/0175413 A1    Jun. 10, 2021

Related U.S. Application Data

(63) Continuation of application No. 16/298,849, filed on Mar. 11, 2019, now Pat. No. 10,964,883.

(30) Foreign Application Priority Data

Aug. 31, 2018   (JP) .............................. JP2018-163553

(51) Int. Cl.
*H01L 43/02* (2006.01)
*H01L 43/10* (2006.01)
(Continued)

(52) U.S. Cl.
CPC ............ *H01L 43/02* (2013.01); *G11C 11/161* (2013.01); *H01L 27/224* (2013.01); *H01L 43/10* (2013.01); *G11C 11/1655* (2013.01); *G11C 11/1657* (2013.01); *G11C 11/1659* (2013.01); *G11C 11/1673* (2013.01); *G11C 11/1675* (2013.01); *H01L 27/228* (2013.01)

(58) Field of Classification Search
CPC .......... H01L 29/4011; H01L 29/40111; H01L 29/40114; H01L 43/10; H01L 27/224; H01L 27/226; H01L 43/08; G11C 11/161; G11C 11/1675; G11C 11/1655; G11C 11/1659; G11C 11/1673
See application file for complete search history.

(56) References Cited

U.S. PATENT DOCUMENTS 8,565,013 B2   10/2013   Bessho et al.
8,637,947 B2    1/2014   Yamane et al.
(Continued)

FOREIGN PATENT DOCUMENTS

JP    2012235015 A    11/2012
JP    2013115401 A     6/2013
(Continued)

*Primary Examiner* — Thanh Y. Tran
(74) *Attorney, Agent, or Firm* — Holtz, Holtz & Volek PC

(57) ABSTRACT

A magnetic storage device includes a magnetoresistive effect element. The magnetoresistive effect element includes a first ferromagnetic layer; a second ferromagnetic layer; a non-magnetic layer between the first ferromagnetic layer and the second ferromagnetic layer; and a first layer provided at a side of the first ferromagnetic layer opposite to a side of the first ferromagnetic layer at which the non-magnetic layer is provided. The first layer includes a rare-earth element and the first layer has a region including boron (B) at a proportion higher than a proportion of boron (B) in the first ferromagnetic layer.

20 Claims, 13 Drawing Sheets

(51) Int. Cl.
*G11C 11/16* (2006.01)
*H01L 27/22* (2006.01)

(56) References Cited

U.S. PATENT DOCUMENTS

| | | | |
|---|---|---|---|
| 8,790,798 B2* | 7/2014 | Shukh | H01L 43/08 |
| | | | 365/171 |
| 8,995,181 B2 | 3/2015 | Watanabe et al. | |
| 9,130,143 B2 | 9/2015 | Nagase et al. | |
| 9,142,756 B2 | 9/2015 | Nagamine et al. | |
| 9,178,134 B2 | 11/2015 | Nakayama et al. | |
| 9,178,137 B2 | 11/2015 | Eeh et al. | |
| 9,184,374 B2 | 11/2015 | Sawada et al. | |
| 9,209,386 B2 | 12/2015 | Nagamine et al. | |
| 9,252,357 B2 | 2/2016 | Watanabe et al. | |
| 9,269,890 B2 | 2/2016 | Nakayama et al. | |
| 9,293,695 B2 | 3/2016 | Ueda et al. | |
| 9,461,240 B2 | 10/2016 | Sawada et al. | |
| 9,620,561 B2 | 4/2017 | Nagase et al. | |
| 9,640,584 B2 | 5/2017 | Nagamine et al. | |
| 9,705,076 B2 | 7/2017 | Nagamine et al. | |
| 9,741,928 B2 | 8/2017 | Ueda et al. | |
| 9,947,862 B2 | 4/2018 | Watanabe et al. | |
| 9,991,313 B2 | 6/2018 | Watanabe et al. | |
| 10,103,318 B2 | 10/2018 | Watanabe et al. | |
| 10,170,519 B2 | 1/2019 | Eeh et al. | |
| 10,263,178 B2 | 4/2019 | Sawada et al. | |
| 10,388,343 B2 | 8/2019 | Oikawa et al. | |
| 10,468,170 B2 | 11/2019 | Eeh et al. | |
| 10,510,950 B2 | 12/2019 | Watanabe et al. | |
| 10,854,252 B2 | 12/2020 | Nagase et al. | |
| 10,873,021 B2 | 12/2020 | Eeh et al. | |
| 2013/0069182 A1* | 3/2013 | Ohsawa | H01F 10/3286 |
| | | | 257/E21.665 |
| 2015/0069554 A1 | 3/2015 | Nakayama et al. | |
| 2017/0110172 A1* | 4/2017 | Stainer | G11C 11/1675 |
| 2017/0125664 A1 | 5/2017 | Tahmasebi et al. | |
| 2017/0263680 A1 | 9/2017 | Yoshino et al. | |
| 2018/0005746 A1 | 1/2018 | Thomas et al. | |
| 2018/0076262 A1 | 3/2018 | Eeh et al. | |
| 2018/0205006 A1 | 7/2018 | Watanabe et al. | |
| 2018/0248114 A1 | 8/2018 | Oguz et al. | |
| 2018/0277745 A1 | 9/2018 | Oikawa et al. | |
| 2019/0019841 A1 | 1/2019 | Eeh et al. | |
| 2019/0131519 A1* | 5/2019 | Ikegawa | H01L 43/02 |
| 2019/0295617 A1 | 9/2019 | Wang et al. | |
| 2020/0091227 A1 | 3/2020 | Iwayama et al. | |
| 2020/0303626 A1 | 9/2020 | Watanabe et al. | |
| 2020/0303632 A1 | 9/2020 | Watanabe et al. | |

FOREIGN PATENT DOCUMENTS

| | | |
|---|---|---|
| JP | 2018006752 A | 1/2018 |
| TW | 201724592 A | 7/2017 |
| TW | 201724596 A | 7/2017 |
| TW | 201812915 A | 4/2018 |

\* cited by examiner

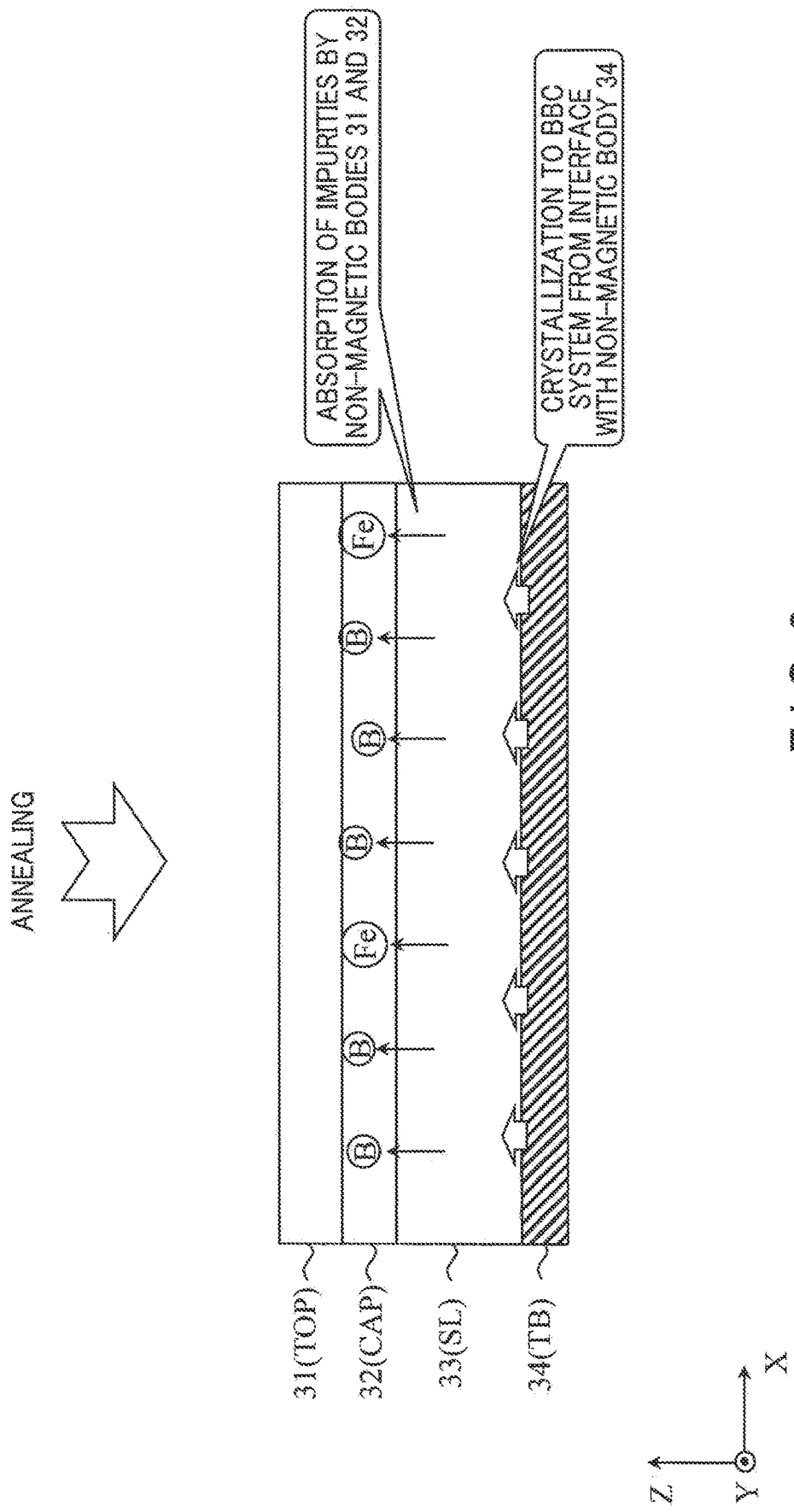
F I G. 6

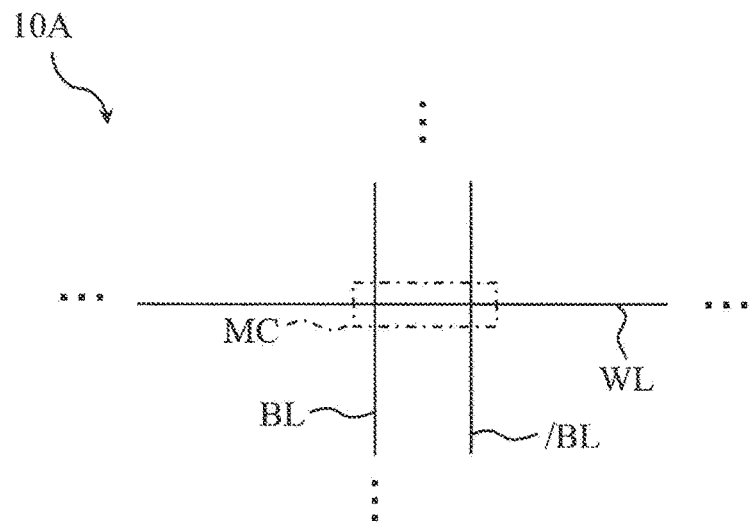
F I G. 13
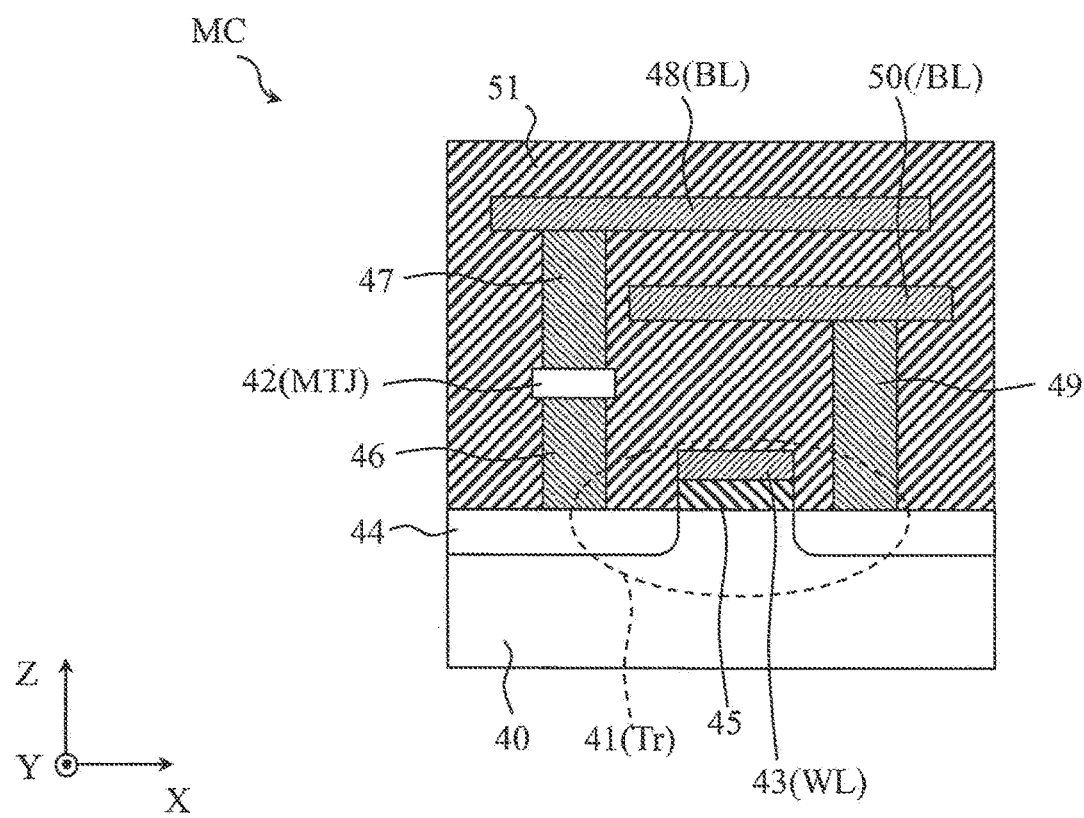
F I G. 14

MAGNETIC STORAGE DEVICE

CROSS-REFERENCE TO RELATED APPLICATIONS

This application is a Continuation application of U.S. application Ser. No. 16/298,849, filed on Mar. 11, 2019 which is based upon and claims the benefit of priority from Japanese Patent Application No. 2018-163553, filed Aug. 31, 2018, the entire contents of all of which are incorporated herein by reference.

FIELD

Embodiments described herein relate generally to a magnetic storage device.

BACKGROUND

A magnetic storage device that has a magnetoresistive effect element is known.

BRIEF DESCRIPTION OF THE DRAWINGS

FIG. 6 is a schematic view to explain the manufacturing method of the magnetoresistive effect element of the magnetic storage device according to the first embodiment.

FIG. 13 is a circuit diagram to explain a configuration of a memory cell array of a magnetic storage device according to a second modification.

FIG. 14 is a cross-sectional view to explain a configuration of a memory cell of the magnetic storage device according to the second modification.

DETAILED DESCRIPTION

In general, according to one embodiment, a magnetic storage device includes a magnetoresistive effect element. The magnetoresistive effect element including: a first ferromagnetic layer; a second ferromagnetic layer; a first non-magnetic layer between the first ferromagnetic layer and the second ferromagnetic layer; a second non-magnetic layer at an opposite side of the first non-magnetic layer relative to the first ferromagnetic layer; and a third non-magnetic layer at an opposite side of the first ferromagnetic layer relative to the second non-magnetic layer. The second non-magnetic layer including rare-earth oxide, and the third non-magnetic layer including ruthenium (Ru) or molybdenum (Mo).

Embodiments will be explained with reference to the accompanying drawings. In the explanations below, structural components having similar functions and configurations will be denoted by the same reference symbols. If structural components indicated by the same reference symbols are distinguished, the reference symbols are accompanied by additional symbols. Such additional symbols may be omitted when differentiation is not needed for the structural components. The additional symbols includes not only subscripts or superscripts, but also, for example, lowercase alphabetical characters following the reference symbols, or indices representing array, etc.

1. First Embodiment

A magnetic storage device according to a first embodiment is described. The magnetic storage device according to the first embodiment includes, for example, a magnetic storage device (MRAM: Magnetoresistive Random Access Memory) by perpendicular magnetic recording using an element having a magnetoresistive effect (MTJ element or magnetoresistive effect element) by a magnetic tunnel junction (MTJ).

1. 1 Configuration

First, the configuration of a magnetic storage device according to the first embodiment is described.

1. 1. 1 Configuration of Magnetic Storage Device

Figure 1:
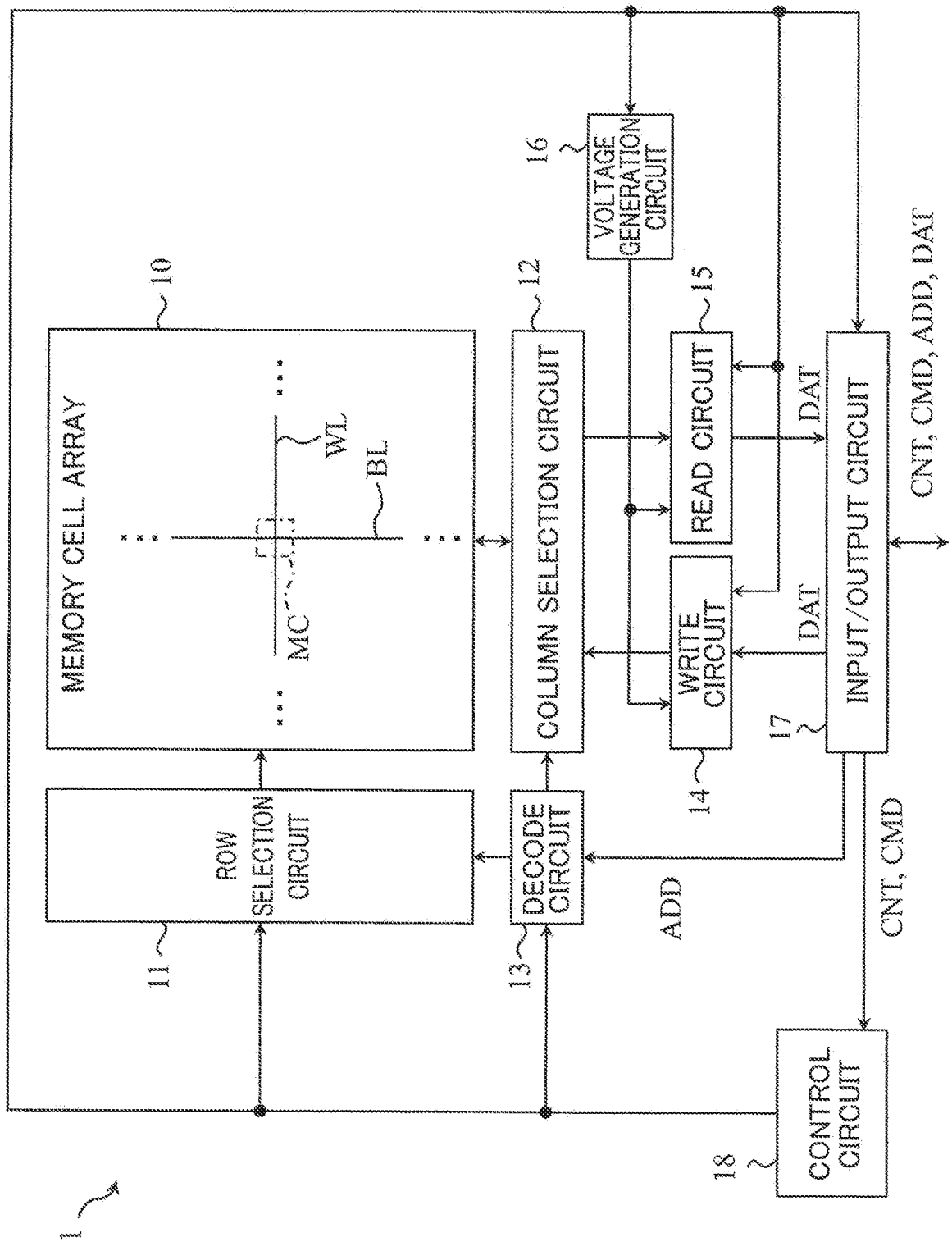
FIG. 1 is a block diagram to explain a configuration of a magnetic storage device according to a first embodiment.

FIG. 1 is a block diagram illustrating the configuration of a magnetic storage device according to the first embodiment. As shown in FIG. 1, the magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a set of a row and a column. Specifically, memory cells MC arranged in the same row are coupled to the same word line WL, and memory cells MC arranged in the same column are coupled to the same bit line BL.

The row selection circuit 11 is coupled to the memory cell array 10 via a word line WL. A decode result of an address ADD (row address) from the decode circuit 13 is supplied to the row selection circuit 11. The row selection circuit 11 sets a word line WL corresponding to a row based on the decode result of the address ADD in a selected state. In the following, a word line WL that has been set in the selected state is referred to as a selected word line WL. In addition, a word line WL other than the selected word line WL is referred to as an unselected word line WL.

The column selection circuit 12 is coupled to the memory cell array 10 via a bit line BL. A decode result of an address ADD (column address) from the decode circuit 13 is supplied to the column selection circuit 12. The column selection circuit 12 sets a column based on the decode result of the address ADD in a selected state. In the following, a bit line BL that has been set in the selected state is referred to as a selected bit line BL. In addition, a bit line BL other than the selected bit line BL is referred to as an unselected bit line BL.

The decode circuit 13 decodes an address ADD from the input/output circuit 17. The decode circuit 13 supplies a decode result of the address ADD to the row selection circuit 11 and the column selection circuit 12. The address ADD includes a column address and a row address to be selected.

The write circuit 14 writes data to a memory cell MC. The write circuit 14 includes, for example, a write driver (not illustrated).

The read circuit 15 reads data from a memory cell MC. The read circuit 15 includes, for example, a sense amplifier (not illustrated).

The voltage generation circuit 16 uses a power supply voltage supplied from an external device (not illustrated) of the magnetic storage device 1 to generate voltages for various types of operations of the memory cell array 10. For example, the voltage generation circuit 16 generates voltages required for writing operation, and outputs the voltages to the write circuit 14. For example, the voltage generation circuit 16 generates voltages required for reading operation, and outputs the voltages to the read circuit 15.

The input/output circuit 17 transfers the address ADD from the external device of the magnetic storage device 1 to the decode circuit 13. The input/output circuit 17 transfers a command CMD from the external device of the magnetic storage device 1 to the control circuit 18. The input/output circuit 17 transmits and receives various types of control signals CNT between the external device of the magnetic storage device 1 and the control circuit 18. The input/output circuit 17 transfers data DAT from the external device of the magnetic storage device 1 to the write circuit 14, and outputs data DAT transferred from the read circuit 15 to the external device of the magnetic storage device 1.

The control circuit 18 controls the operations of the row selection circuit 11, the column selection circuit 12, the decode circuit 13, the write circuit 14, the read circuit 15, the voltage generation circuit 16, and the input/output circuit 17 in the magnetic storage device 1, based on control signals CNT and commands CMD.

1. 1. 2 Configuration of Memory Cell Array

Figure 2:
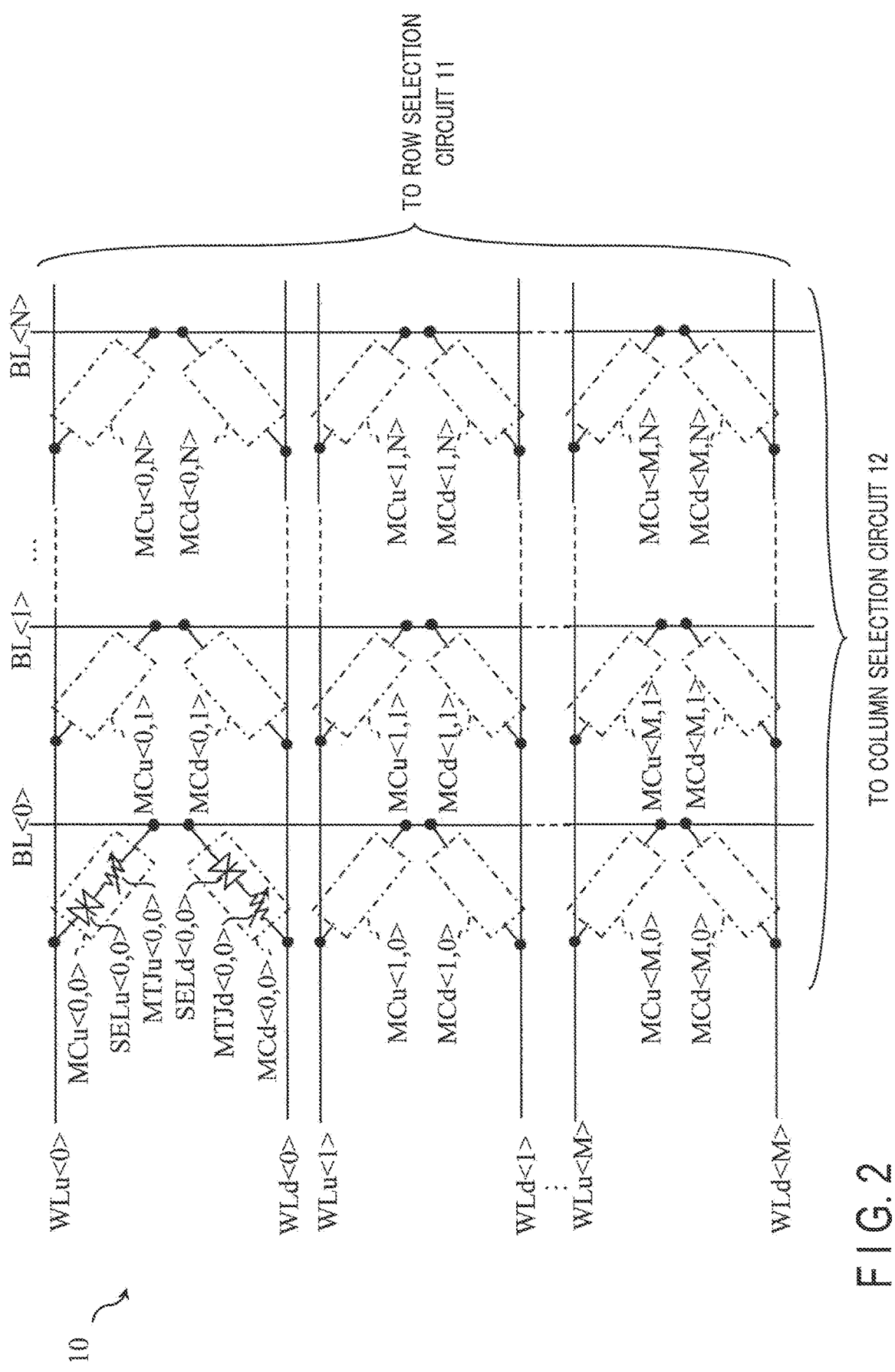
FIG. 2 is a circuit diagram to explain a configuration of a memory cell array of the magnetic storage device according to the first embodiment.

Next, the configuration of the memory cell array of the magnetic storage device according to the first embodiment is described with reference to FIG. 2. FIG. 2 is a circuit diagram illustrating the configuration of the memory cell array of the magnetic storage device according to the first embodiment. In FIG. 2, the word lines WL are distinguished by additional symbols including two lowercase alphabetical characters ("u" and "d") and indices ("< >").

As shown in FIG. 2, the memory cells MC (MCu and MCd) are arranged in a form of a matrix within the memory cell array 10, each of which is associated with a set of one of the bit lines BL (BL<0>, BL<1>, ..., BL<N>) and one of word lines WLd (WLd<0>, WLd<1>, ..., WLd<M>) and word lines WLu (WLu<0>, WLu<1>, ..., WLu<M>) (M and N each are any integer). Namely, a memory cell MCd<i, j> ($0 \leq i \leq M$, $0 \leq j \leq N$) is coupled between a word line WLd<i> and a bit line BL<j>, and a memory cell MCu<i, j> is coupled between a word line WLu<i> and a bit line BL<j>.

The additional symbols "d" and "u" respectively indicate a word line arranged at a lower part relative to a bit line BL, and a word line arranged at an upper part relative to a bit line BL, for the sake of convenience. An example of a three-dimensional configuration of the memory cell array 10 is described later.

A memory cell MCd<i, j> includes a switching element SELd<i, j> and a magnetoresistive effect element MTJd<i, j> connected in series. A memory cell MCu<i, j> includes a switching element SELu<i, j> and a magnetoresistive effect element MTJu<i, j> connected in series.

A switching element SEL has a function of a switch that controls a current supplied to a magnetoresistive effect element MTJ at a time of writing and reading data relative to the corresponding magnetoresistive effect element MTJ. Specifically, for example, a switching element SEL in a memory cell MC blocks a current (off state) flow by functioning as an insulator which has a high resistance value if a voltage applied to the memory cell MC falls below a voltage threshold Vth, and allows a current flow (on state) by functioning as a conductor which has a low-resistance value if a voltage applied to the memory cell MC exceeds the voltage threshold Vth. Namely, the switching element SEL has a function of switching between blocking or allowing a current flow in accordance with a value of a voltage to be applied to the memory cell MC, regardless of the direction of current flow.

The switching element SEL may be, for example, a selector having two terminals. When the voltage applied between two terminals is equal to or lower than a threshold, the switching element is in a "high resistance" state, for example, an electrically non-conductive state. If the voltage to be applied between two terminals is equal to or higher than the threshold, the switching element is turned to a "low resistance" state, for example, an electrically conductive state. The switching element may have this function regardless of the polarity of the voltage. The switching element contains at least one type of chalcogen element selected from a group consisting of tellurium (Te), selenium (Se), and sulfur (S). Alternatively, the switching element may contain chalcogenide which is a compound containing the chalcogen element. The switching element may include at least one or more elements selected from a group consisting of boron (B), aluminum (Al), gallium (Ga), indium (In), carbon (C), silicon (Si), germanium (Ge), tin (Sn), arsenic (As), phosphorus (P), and antimony (Sb).

The magnetoresistive effect element MTJ can switch a resistance value between a low-resistance state and a high-resistance state, by a current, the amount of which is controlled by the switching element SEL. The magnetoresistive effect element MTJ is capable of writing data by a change of the resistance state, and functions as a memory element that is capable of storing written data in a non-volatile manner, and capable of reading data in accordance with the change of the resistance state.

Figure 3:
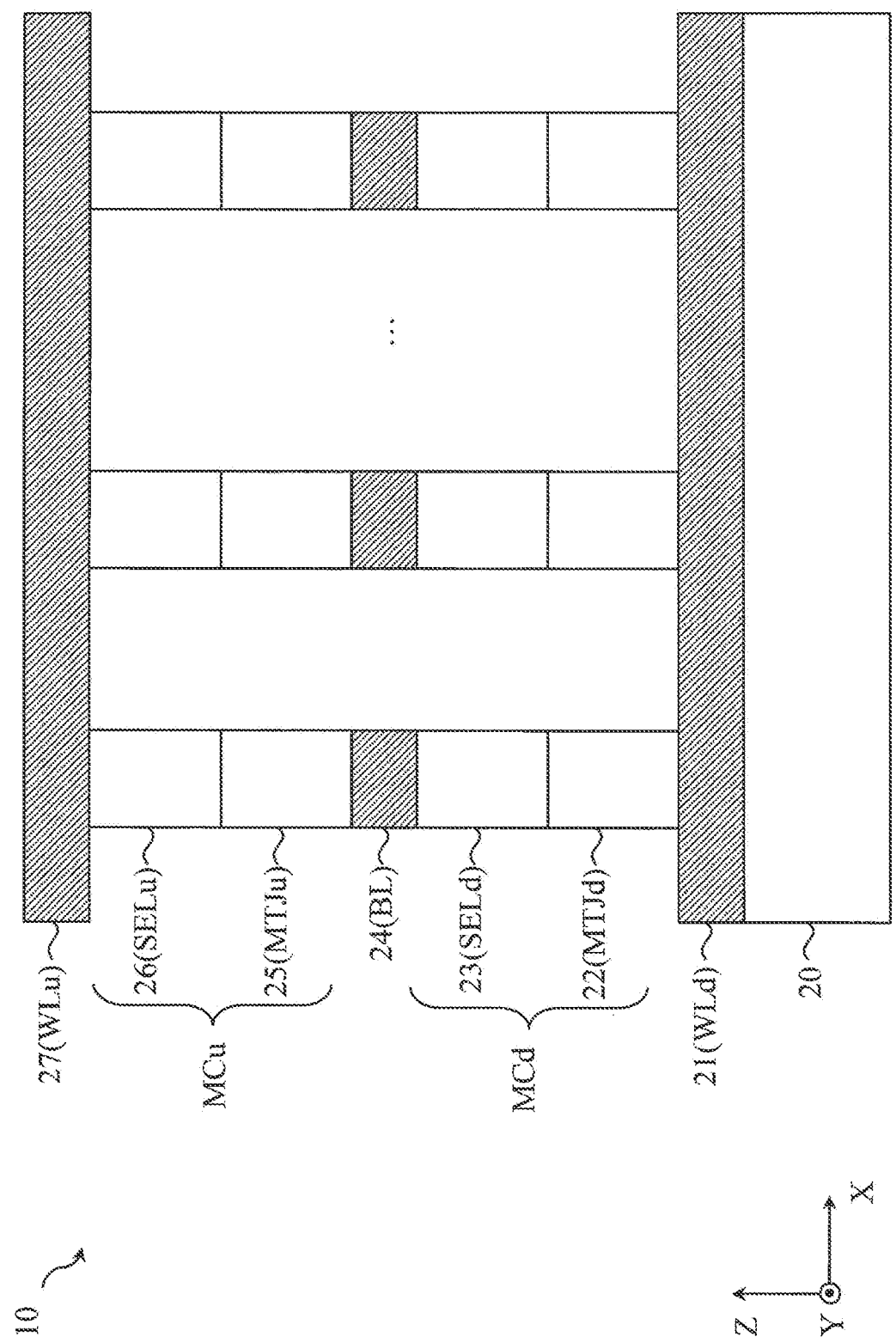
FIG. 3 is a sectional view to explain a configuration of the memory cell array of the magnetic storage device according to the first embodiment.

Next, a cross-sectional configuration of the memory cell array 10 is described with reference to FIG. 3. FIG. 3 illustrates an example of a cross-sectional configuration of the memory cell array of the magnetic storage device according to the first embodiment, taken along a word line.

As shown in FIG. 3, the magnetic storage device 1 is disposed on a semiconductor substrate 20. In the following description, a plane parallel to the surface of the semiconductor substrate 20 is represented as an XY plane, and a direction perpendicular to the XY plane is represented as a Z-direction. A direction along a word line WL is represented as an X-direction, and a direction along a bit line BL is represented as a Y-direction.

For example, a plurality of conductors 21 each functioning as a word line WLd are disposed on the upper surface of the semiconductor substrate 20. The conductors 21, for example, are arranged along the Y-direction, and each extend along the X-direction. FIG. 3 illustrates one of the conductors 21. A plurality of elements 22 each functioning as a magnetoresistive effect element MTJd are disposed on the upper surface of one conductor 21, for example, along the X-direction. Namely, elements 22 arranged along the X-direction are commonly coupled with one conductor 21. An element 23 functioning as a switching element SELd is disposed on the upper surface of each of the elements 22. A conductor 24 functioning as a bit line BL is disposed on the upper surface of each of the elements 23. The conductors 24, for example, are arranged along the X-direction, and each extend along the Y-direction. Namely, elements 23 arranged along the Y-direction are commonly coupled with one conductor 24.

A plurality of elements 25 each functioning as a magnetoresistive effect element MTJu are disposed on the upper surface of each of the conductors 24. Namely, the elements 25 arranged along the Y-direction are commonly coupled with one conductor 24. The element 25 has a functional structure equivalent to that of the element 22, for example. An element 26 functioning as a switching element SELu is disposed on the upper surface of each of the elements 25. The element 26 has a functional structure equivalent to that of the element 23, for example. A conductor 27 functioning as a word line WLu is disposed on the upper surface of each of the elements 26 arranged along the X-direction. A plurality of the conductors 27 are arranged along the Y-direction. The conductors 27, for example, each extend along the X-direction.

As can be seen from the aforementioned configuration, the memory cell array 10 has the configuration that a set of two word lines WLd and WLu is associated with a bit line BL. The memory cell array 10 has a stacked cross-point configuration where a memory cell MCd is provided between a word line WLd and a bit line BL, and a memory cell MCu is provided between the bit line BL and a word line WLu. In the stacked cross-point configuration illustrated in FIG. 3, a memory cell MCd is associated with a lower layer, and a memory cell MCu is associated with an upper layer. Namely, among two memory cells MC commonly coupled with a single bit line BL, a memory cell MC disposed in an upper layer of the bit line BL corresponds to a memory cell MCu having an additional symbol "u", and a memory cell MC disposed in a lower layer of the bit line BL corresponds to a memory cell MCd having an additional symbol "d".

In an example of FIG. 3, the conductor 21, elements 22 and 23, conductor 24, elements 25 and 26, and conductor 27 are in contact with each other; however, other elements may be provided between each of the above elements.

1. 1. 3 Configuration of Magnetoresistive Effect Element

Figure 4:
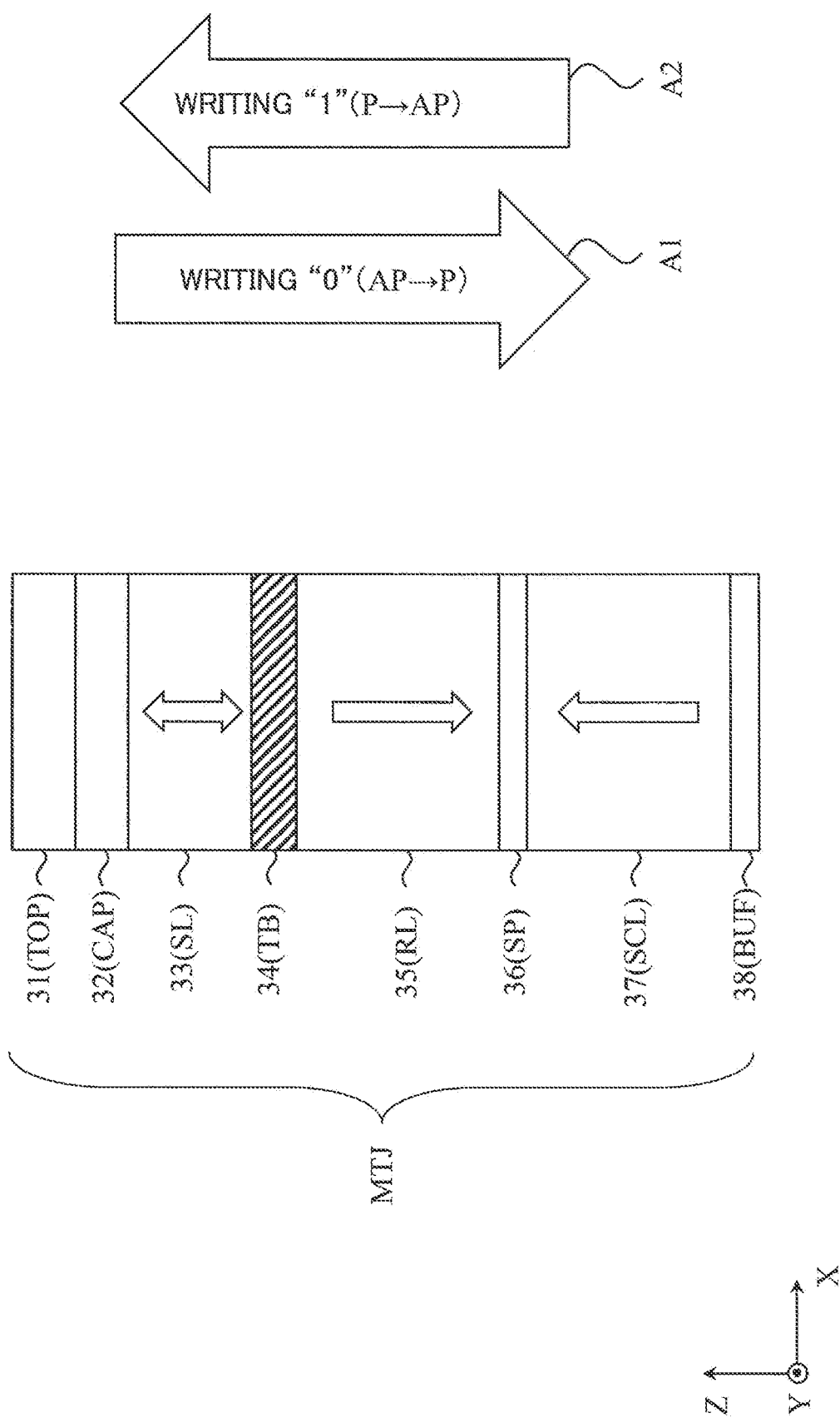
FIG. 4 is a sectional view to explain a configuration of a magnetoresistive effect element of the magnetic storage device according to the first embodiment.

Next, the configuration of the magnetoresistive effect element of the magnetic storage device according to the first embodiment is described with reference to FIG. 4. FIG. 4 is a cross-sectional view illustrating the configuration of a magnetoresistive effect element of the magnetic storage device according to the first embodiment. FIG. 4 illustrates, for example, an example of a cross section of the magnetoresistive effect element MTJ (i.e., element 22 or 25) shown in FIG. 3, taken along a plane perpendicular to the Z-direction (for example, an XZ plane).

As shown in FIG. 4, each of elements 22 and 25 includes a non-magnetic layer 31 functioning as a top layer TOP, a non-magnetic layer 32 functioning as a cap layer CAP, a ferromagnetic layer 33 functioning as a storage layer SL, a non-magnetic layer 34 functioning as a tunnel barrier layer TB, a ferromagnetic layer 35 functioning as a reference layer RL, a non-magnetic layer 36 functioning as a spacer layer SP, a ferromagnetic layer 37 functioning as a shift cancelling layer SCL, and a non-magnetic layer 38 functioning as a buffer layer BUF.

In the element 22, a plurality of materials: non-magnetic layer 38; ferromagnetic layer 37; non-magnetic layer 36; ferromagnetic layer 35; non-magnetic layer 34; ferromagnetic layer 33; non-magnetic layer 32; and non-magnetic layer 31, are stacked in the order given from the word line WLd side to the bit line BL side (in the Z-axis direction). In the element 25, a plurality of materials: non-magnetic layer 38; ferromagnetic layer 37; non-magnetic layer 36; ferromagnetic layer 35; non-magnetic layer 34; ferromagnetic layer 33; non-magnetic layer 32; and non-magnetic layer 31, are stacked in the order given from the bit line BL side to the word line WLu side (in the Z-axis direction). The elements 22 and 25 each function as, for example, a perpendicularly magnetized MTJ element in which the magnetization direction of the magnetic layer forming the elements 22 and 25 is perpendicular to the film surface.

The non-magnetic layer 31 is a non-magnetic conductor that has a function as a top electrode that improves electrical connectivity between a first end of the magnetoresistive effect element MTJ, and a bit line BL or a word line WL. The non-magnetic layer 31 does not have a particular crystal structure (but has an amorphous structure), and the non-magnetic layer 31 includes, for example, at least one element selected from ruthenium (Ru) and molybdenum (Mo). In a case where the non-magnetic layer 31 includes molybdenum (Mo), the non-magnetic layer 31 may further include metalloid such as boron (B), silicon (Si), or carbon (C), to maintain the amorphous state. The non-magnetic layer 31 may have, for example, a film thickness of 0.5 nanometers (nm) or more and 3 nanometers or less.

The non-magnetic layer 32 is non-magnetic rare-earth oxide. The non-magnetic layer 32 suppresses diffusion of materials in the non-magnetic layer 31 to the ferromagnetic layer 33, and has a function of absorbing elements such as boron (B) diffused from the ferromagnetic layer 33 during the manufacturing process of the magnetoresistive effect element MTJ. The non-magnetic layer 32 includes, for example, at least one oxide of rare-earth element selected from yttrium (Y), lanthanum (La), neodymium (Nd), samarium (Sm), scandium (Sc), europium (Eu), gadolinium (Gd), terbium (Tb), and dysprosium (Dy). As stated above, the non-magnetic layer 32 may further include boron (B) as an element absorbed from the ferromagnetic layer 33. In addition, the non-magnetic layer 32 may further include iron (Fe) or cobalt (Co) as an element further absorbed from the ferromagnetic layer 33. The non-magnetic layer 32 may be added with iron (Fe) in advance when forming a film, regardless of whether or not iron (Fe) is diffused from the ferromagnetic layer 33. The non-magnetic layer 32 may have, for example, a film thickness of 0.5 nanometers or more and 2 nanometers or less (more preferably, 0.7 nanometers or more and 1.3 nanometers or less).

Via the aforementioned configuration, the non-magnetic layer 31 may improve a function of element absorption of the non-magnetic layer 32, in addition of the function of the top electrode. Namely, the non-magnetic layer 31 may contribute to removal of elements unnecessary for crystallization of the ferromagnetic layer 33, together with the non-magnetic layer 32.

The ferromagnetic layer 33 has ferromagnetic properties, and has an axis of easy magnetization in a direction perpendicular to the film surface. The ferromagnetic layer 33 has a magnetization direction toward either of the bit line BL side or the word line WL side. The ferromagnetic layer 33 may include, for example, cobalt-iron-boron (CoFeB) or iron boride (FeB), and may have a body-centered cubic (bcc) crystal structure. The ferromagnetic layer 33 has, for example, a film thickness of 1 nanometer or more and 3 nanometers or less (more preferably, 1 nanometer or more and 2 nanometers or less). The ferromagnetic layer 33 is not limited to have a single-layer structure of the aforementioned layer, but may have a multi-layered structure.

The non-magnetic layer 34 is a non-magnetic insulation film which includes, for example, magnesium oxide (MgO). The non-magnetic layer 34 is disposed between the ferromagnetic layer 33 and the ferromagnetic layer 35, and these bodies 33, 34, and 35 form a magnetic tunnel junction.

The ferromagnetic layer 35 has ferromagnetic properties, and has an axis of easy magnetization in a direction perpendicular to the film surface. The ferromagnetic layer 35 has a magnetization direction toward either of the bit line BL side or the word line WL side. The ferromagnetic layer 35 includes, for example, cobalt-iron-boron (CoFeB) or iron boride (FeB). The magnetization direction of the ferromagnetic layer 35 is fixed, and is directed to the ferromagnetic layer 37 in the example of FIG. 4. The expression, "magnetization direction is fixed", means that the magnetization direction is not changed due to the amount of current (spin torque) that may be able to reverse the magnetization direction of the ferromagnetic layer 33.

Although not illustrated in FIG. 4, the ferromagnetic layer 35 may be a stacked structure including multiple layers. Specifically, for example, the stacked structure forming the ferromagnetic layer 35 may be a structure in which a ferromagnetic layer is additionally stacked below a surface of the ferromagnetic layer 37 side of an interface layer including cobalt-iron-boron (CoFeB) or iron boride (FeB) via a non-magnetic conductor. The non-magnetic conductor in the stacked structure forming the ferromagnetic layer 35 may include at least one metal selected, for example, from tantalum (Ta), hafnium (Hf), tungsten (W), zirconium (Zr), molybdenum (Mo), niobium (Nb), and titanium (Ti). The additionally stacked ferromagnetic layer in the stacked structure forming the ferromagnetic layer 35 may include at least one artificial lattice selected from a multi-layered film of cobalt (Co) and platinum (Pt) (Co/Pt multi-layered film), a multi-layered film of cobalt (Co) and nickel (Ni) (Co/Ni multi-layered film), and a multi-layered film of cobalt (Co) and palladium (Pd) (Co/Pd multi-layered film).

The non-magnetic layer 36 is a non-magnetic conductive film which includes at least one element selected, for example, from ruthenium (Ru), osmium (Os), iridium (Ir), vanadium (V), and chromium (Cr).

The ferromagnetic layer 37 has ferromagnetic properties, and has an axis of easy magnetization in a direction perpendicular to the film surface. The ferromagnetic layer 37 includes at least one alloy selected, for example, from cobalt platinum (CoPt), cobalt nickel (CoNi), and cobalt palladium (CoPd). The ferromagnetic layer 37 may be a stacked structure including multiple layers, similar to the ferromagnetic layer 35. In this case, the ferromagnetic layer 37 may include at least one artificial lattice selected from a multi-layered film of cobalt (Co) and platinum (Pt) (Co/Pt multi-layered film), a multi-layered film of cobalt (Co) and nickel (Ni) (Co/Ni multi-layered film), and a multi-layered film of cobalt (Co) and palladium (Pd) (Co/Pd multi-layered film).

The ferromagnetic layer 37 has a magnetization direction toward either of the bit line BL side or the word line WL side. The magnetization direction of the ferromagnetic layer 37 is fixed, and is directed to the ferromagnetic layer 35 in the example of FIG. 4. The expression, "magnetization direction is fixed", means that the magnetization direction is not changed due to the amount of current (spin torque) that may be able to reverse the magnetization direction of the ferromagnetic layer 33.

The ferromagnetic bodies 35 and 37 are anti-ferromagnetically coupled by the non-magnetic layer 36. Namely, the ferromagnetic bodies 35 and 37 are coupled so as to have mutually antiparallel magnetization directions. Accordingly, in the example of FIG. 4, the magnetization direction of the ferromagnetic layer 35 is directed to the ferromagnetic layer 37. The coupled structure of the ferromagnetic layer 35, non-magnetic layer 36, and ferromagnetic layer 37 is referred to as a SAF (Synthetic Anti-Ferromagnetic) structure. Via this structure, the ferromagnetic layer 37 can cancel an influence of the leakage magnetic field (stray field) of the ferromagnetic layer 35 to the magnetization direction of the ferromagnetic layer 33. Accordingly, the occurrence of asymmetry in magnetization reversal probability due to an external factor caused by stray field of the ferromagnetic layer 35, etc. (namely, the probability of reversal of magnetization direction is different in one direction and in an opposite direction) in the ferromagnetic layer 33 is suppressed.

The non-magnetic layer 38 is a non-magnetic conductive film which has a function as a bottom electrode that improves electrical connectivity between a second end of the magnetoresistive effect element MTJ and a bit line BL or a word line WL. The non-magnetic layer 38 includes, for example, a refractory metal. The refractory metal indicates a material whose melting point is higher than that of iron (Fe) and cobalt (Co), and includes at least one element selected, for example, from zirconium (Zr), hafnium (Hf), tungsten (W), chromium (Cr), molybdenum (Mo), niobium (Nb), titanium (Ti), tantalum (Ta), vanadium (V), ruthenium (Ru), and platinum (Pt).

In the first embodiment, a spin injection write method is adopted in which a write current is directly supplied to the magnetoresistive effect element MTJ, a spin torque is injected into the storage layer SL and the reference layer RL by the write current, and the magnetization directions of the storage layer SL and the reference layer RL are controlled. The magnetoresistive effect element MTJ can be one of a low-resistance state and a high-resistance state, depending on whether the magnetization directions of the storage layer SL and the reference layer RL are parallel or antiparallel.

If a write current Iw0 of a certain amount that flows in the direction indicated by arrow A1 in FIG. 4, in other words, the direction from the storage layer SL toward the reference layer RL, is supplied to the magnetoresistive effect element MTJ, the magnetization directions of the storage layer SL and the reference layer RL become parallel. In this parallel state, the resistance value of the magnetoresistive effect element MTJ becomes lowest, and the magnetoresistive effect element MTJ is set to a low-resistance state. This low-resistance state is called a "P (Parallel) state", and is defined, for example, as a state of data "0".

If a write current Iw1 greater than the write current Iw0 that flows in the direction indicated by arrow A2 in FIG. 4, in other words, the direction from the reference layer RL toward the storage layer SL (the opposite direction as arrow A1), is supplied to the magnetoresistive effect element MTJ, the magnetization directions of the storage layer SL and the reference layer RL become antiparallel. In this antiparallel state, the resistance value of the magnetoresistive effect element MTJ becomes highest, and the magnetoresistive effect element MTJ is set to a high-resistance state. The high-resistance state is called an "AP (Anti-Parallel) state", and is defined, for example, as a state of data "1".

The descriptions below follow the aforementioned data-defining method; however, the method defining data "1" and data "0" is not limited to the aforementioned method. For example, the P state may be defined as data "1", and the AP state may be defined as data "0".

1. 2 Manufacturing Method

Next, a method for manufacturing the magnetoresistive effect element of the magnetic storage device according to the first embodiment is described.

FIGS. 5-7 and 9 are schematic views to explain the manufacturing method of the magnetoresistive effect element of the magnetic storage device according to the first embodiment. FIGS. 5-7 and 9 illustrate each layer forming the top layer TOP, the cap layer CAP, the storage layer SL, and the tunnel barrier layer TB in the magnetoresistive effect element MTJ, and does not illustrate the other layers.

Figure 5:
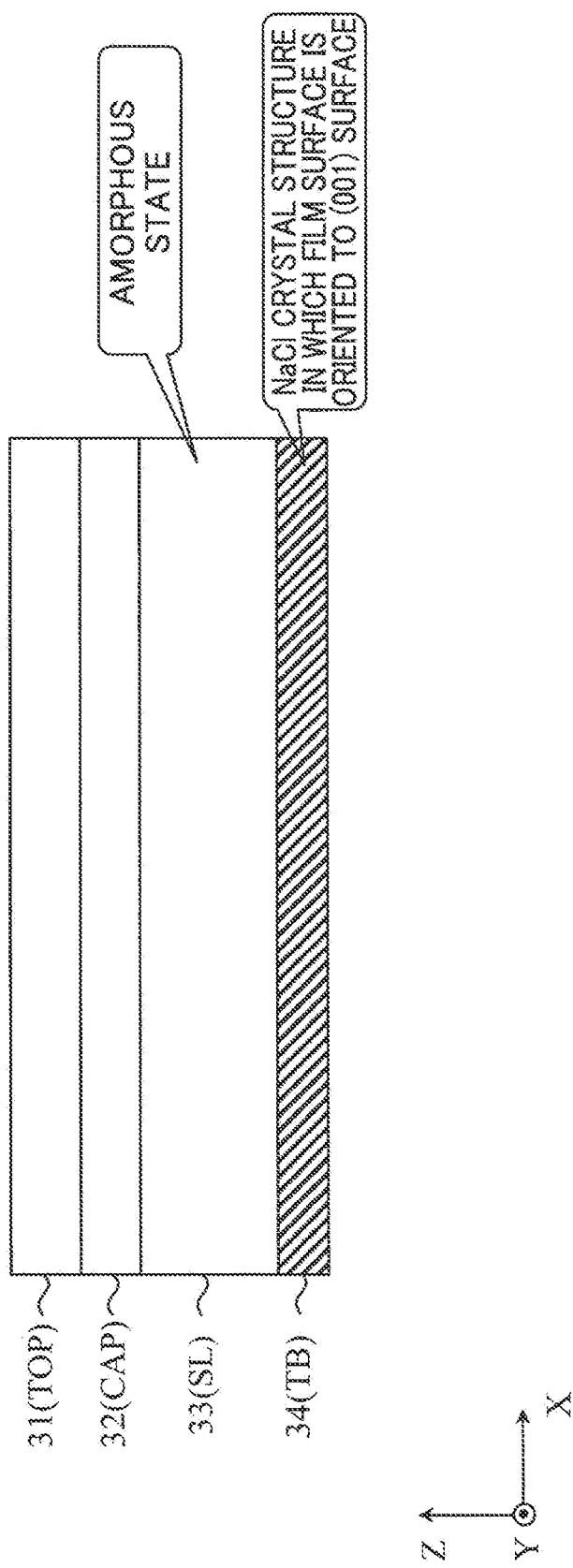
FIG. 5 is a schematic view to explain a manufacturing method of the magnetoresistive effect element of the magnetic storage device according to the first embodiment.
Figure 7:
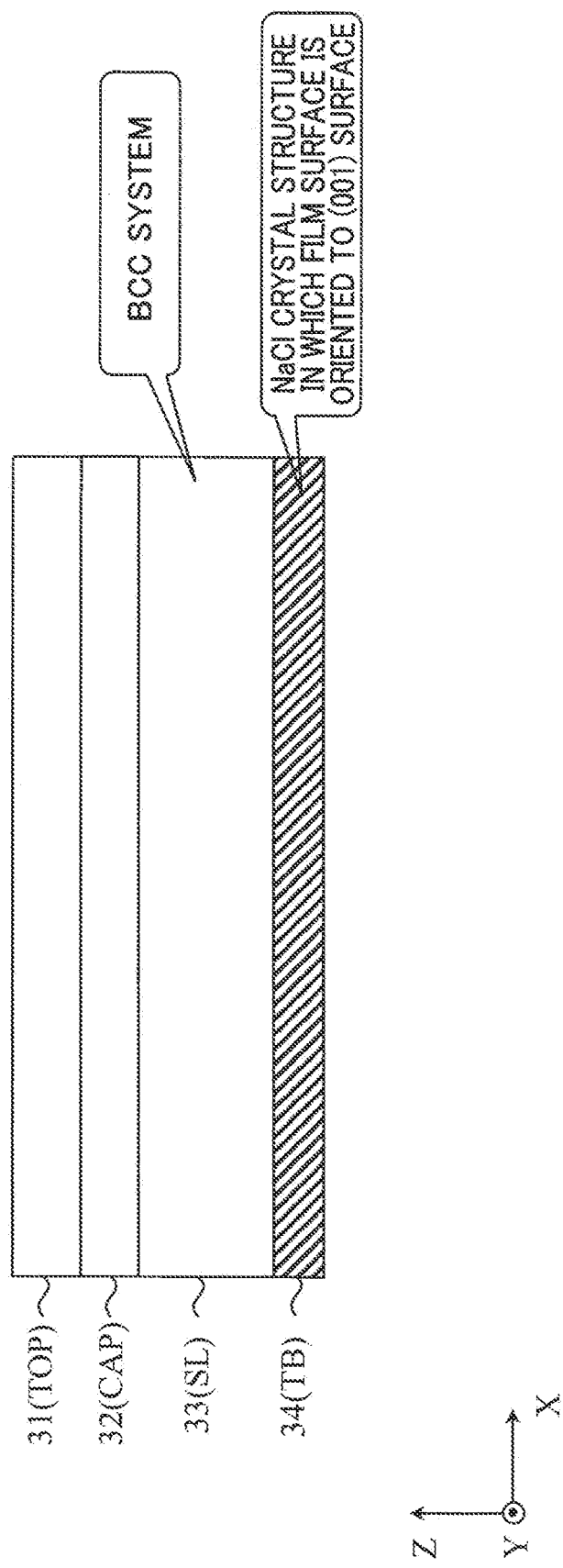
FIG. 7 is a schematic view to explain the manufacturing method of the magnetoresistive effect element of the magnetic storage device according to the first embodiment.
Figure 9:
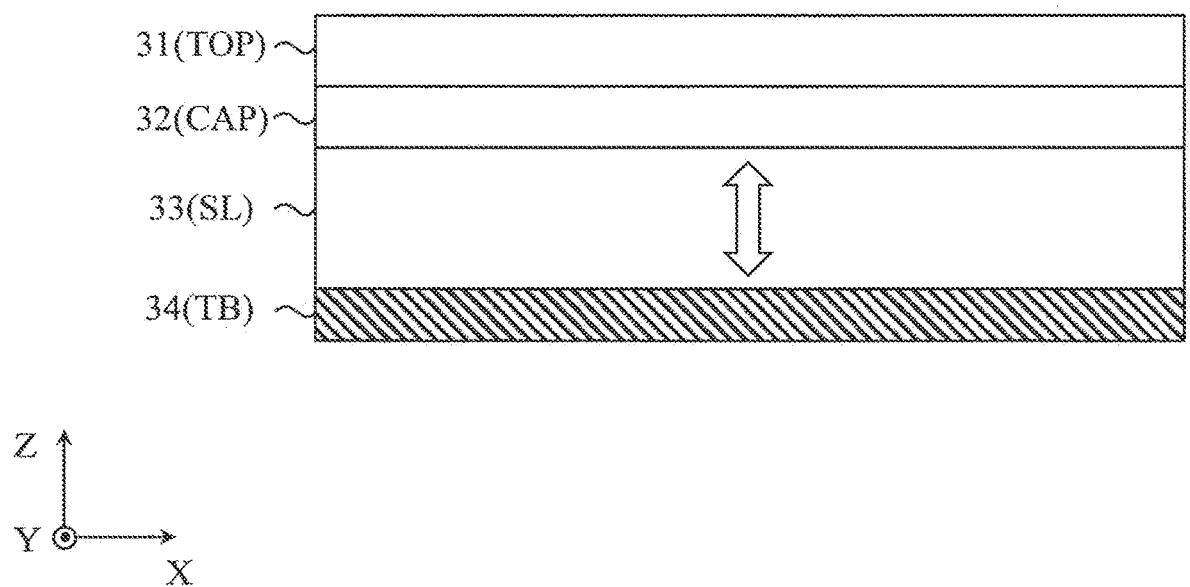
FIG. 9 is a schematic view to explain the manufacturing method of the magnetoresistive effect element of the magnetic storage device according to the first embodiment.

FIG. 5 illustrates a state after various types of materials intended to function as the magnetoresistive effect element MTJ are stacked, and prior to performing an annealing processing. FIG. 6 illustrates a state during the annealing processing, after the state of FIG. 5. FIG. 7 illustrates a state after the annealing processing has been finished, after the state of FIG. 6. FIG. 9 illustrates a state where a function as a storage layer SL is realized by a magnetization processing, after the state of FIG. 7.

Figure 8:
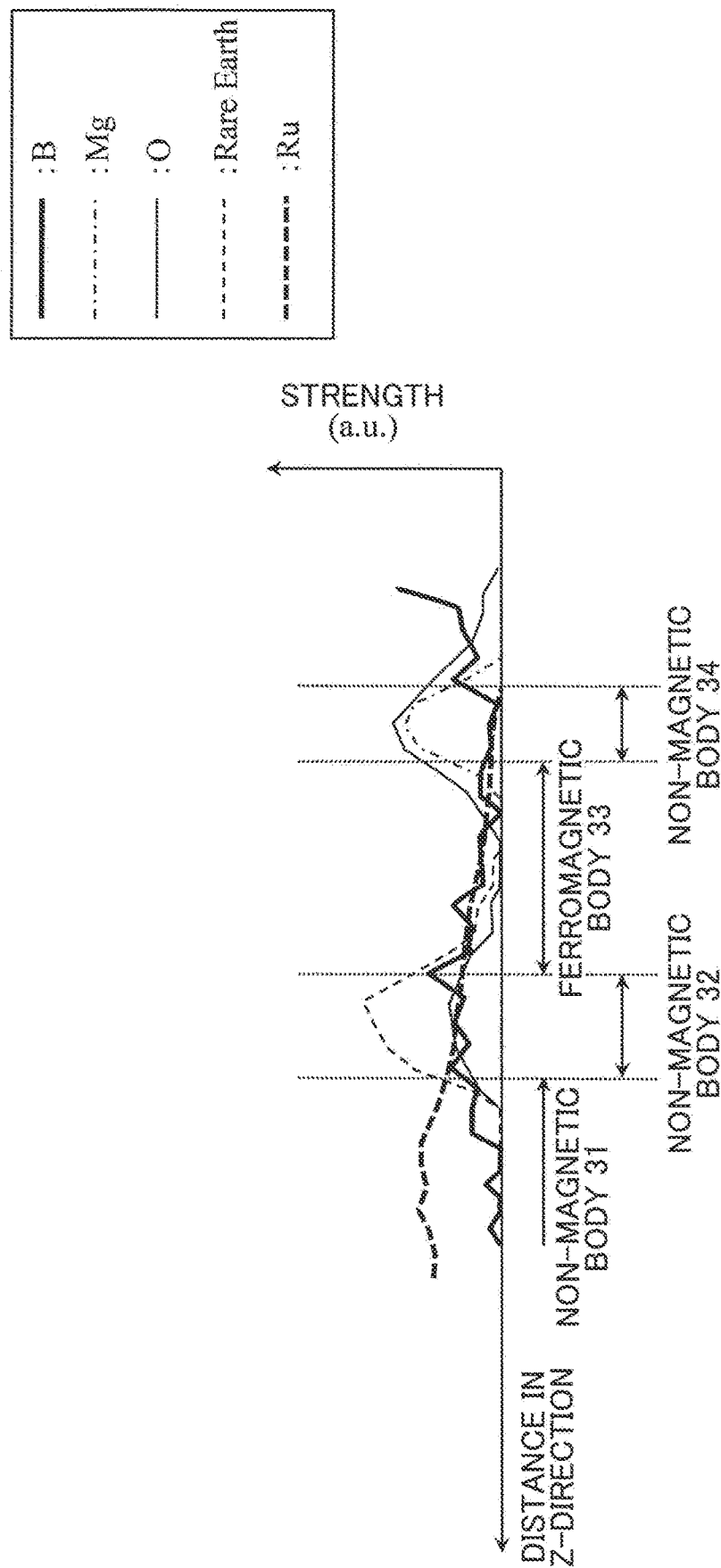
FIG. 8 is a diagram to explain a composition of the magnetoresistive effect element of the magnetic storage device according to the first embodiment.

FIG. 8 is a diagram to explain a composition of the magnetoresistive effect element of the magnetic storage device according to the first embodiment. FIG. 8 illustrates an example of a measurement result by the electron energy loss spectroscopy (EELS) as a graph in which the abscissa axis represents a distance in the Z-direction, and the ordinate axis represents a strength, and illustrates part of the composition of the magnetoresistive effect element after the annealing processing. Specifically, FIG. 8 illustrates boron (B) by a bold solid line, magnesium (Mg) by an alternating long and short dashed line, and oxygen (O) by a solid line, as part of the composition. In FIG. 8, a rare-earth element in the non-magnetic layer 32 (indicated as "Rare Earth" in FIG. 8) is indicated by a dashed line, and ruthenium (Ru) as an example of metal in the non-magnetic layer 31 is indicated by a bold dashed line.

In the following, the states of FIGS. 5-7 and 9 are described in the order given.

As shown in FIG. 5, the non-magnetic layer 34, the ferromagnetic layer 33, the non-magnetic layer 32, and the non-magnetic layer 31 are stacked in the order given. If the non-magnetic layer 34 is magnesium oxide (MgO), the non-magnetic layer 34 is stacked in a state of a sodium chloride (NaCl) crystal structure in which the film surface is oriented to the (001) surface, and the ferromagnetic layer 33 is stacked in an amorphous state.

Next, as shown in FIG. 6, annealing processing is performed to each of the stacked layers in FIG. 5. Specifically, heat (for example, 400° C. or less) is applied externally to each layer for a predetermined period of time so that the ferromagnetic layer 33 is converted from the amorphous state to a crystalline substance. The non-magnetic layer 34 may function to control the orientation of the crystal structure of the ferromagnetic layer 33. Namely, the ferromagnetic layer 33 may develop a crystal structure by using the non-magnetic layer 34 as a seed. Accordingly, the ferromagnetic layer 33 is oriented to the same crystal surface as that of the non-magnetic layer 34, and forms a bcc crystal structure.

In the following description, the annealing processing in which heat of 400° C. or less is applied is referred to as "annealing processing with relatively lower temperature" in comparison with "annealing processing with relatively higher temperature" in which heat of 400° C. or more is applied.

During the aforementioned annealing processing, elements included in each layer may be diffused in other ambient layers. Specifically, for example, during the annealing processing, metal such as ruthenium (Ru) in the non-magnetic layer 31 may be diffused in ambient layers. The non-magnetic layer 32 suppresses diffusion of elements in the non-magnetic layer 31, and entrance of the elements, which are diffused from the non-magnetic layer 31, in the ferromagnetic layer 33. Accordingly, an increase of impurities in the ferromagnetic layer 33 can be suppressed, and the crystallization of the ferromagnetic layer 33 can be promoted with high quality.

In addition, during the annealing processing, boron (B) in the ferromagnetic layer 33 may be diffused in the ambient layers. Here, boron (B) in the ferromagnetic layer 33 at the time of forming a film may be excessive when crystallizing the ferromagnetic layer 33. Accordingly, it is preferable that boron (B) is sufficiently diffused from the ferromagnetic layer 33 by the annealing processing to realize a crystal structure of the ferromagnetic layer 33 with high quality. As described above, since the non-magnetic layer 32 has properties of easily absorbing boron (B) in the ferromagnetic layer 33, the non-magnetic layer 32 can contribute to crystallization of the ferromagnetic layer 33 with high quality. During the annealing processing, iron (Fe) in the ferromagnetic layer 33 may also be diffused in the non-magnetic layer 32.

By disposing the non-magnetic layer 31 on a surface of the non-magnetic layer 32 opposite from a surface on which the ferromagnetic layer 33 is formed, the ability of absorbing boron (B) of the non-magnetic layer 32 can be improved in the annealing processing with relatively lower temperature. Via this processing, crystallization of the ferromagnetic layer 33 can be promoted without increasing the temperature in the annealing processing to be higher than 400° C.

Next, as shown in FIG. 7, the annealing processing in FIG. 6 is finished. As described above, the ferromagnetic layer 33 is crystallized to a bcc crystal structure with high quality via the annealing with relatively lower temperature due to the non-magnetic bodies 31 and 32.

Specifically, as shown in FIG. 8, after the annealing processing with relatively lower temperature is finished, the profile of strength corresponding to boron (B) included in the magnetoresistive effect element MTJ does not have a peak in a region in which the ferromagnetic layer 33 is disposed. The strength corresponding to boron (B) is stronger in a region in which the non-magnetic layer 32 is disposed than in a region in which the ferromagnetic layer 33 is disposed. Accordingly, it is understood that a large amount of boron (B) included in the ferromagnetic layer 33 at the time of forming a film has been absorbed in the non-magnetic layer 32 via the annealing processing with relatively lower temperature.

Next, as shown in FIG. 9, for each layer in which the annealing processing has been finished in FIG. 7, a magnetization processing is performed. Specifically, the ferromagnetic layer 33 is magnetized by externally applying a magnetic field of a degree sufficient for magnetizing the ferromagnetic layer 33 toward a predetermined direction (not illustrated). Via this processing, the ferromagnetic layer 33 realizes a function as the storage layer SL.

The manufacturing of the magnetoresistive effect element MTJ is finished by the above processing.

1. 3 Advantageous Effects of Present Embodiment

According to the first embodiment, the non-magnetic layer 34 that functions as a tunnel barrier layer TB and the non-magnetic layer 32 that functions as a cap layer CAP are disposed on the ferromagnetic layer 33 that functions as a storage layer SL, and the non-magnetic layer 34 and the non-magnetic layer 32 are disposed opposite to each other with respect to the ferromagnetic layer 33. The non-magnetic layer 32 includes rare-earth oxide. Accordingly, boron (B) in the ferromagnetic layer 33 can be extracted during the annealing processing, thereby the ferromagnetic layer 33 can be crystallized with high quality by the epitaxial orientation from the interface with the non-magnetic layer 34. Thus, it is possible to improve the perpendicular magnetic anisotropy and the tunnel magnetoresistive ratio (TMR ratio) of the ferromagnetic layer 33.

In addition, the non-magnetic layer 31 that functions as a top layer (TOP) is disposed on the non-magnetic layer 32, at the opposite side of the ferromagnetic layer 33 with respect to the non-magnetic layer 32. The non-magnetic layer 31 includes, for example, at least one element selected from ruthenium (Ru) and molybdenum (Mo). Via this structure, the aforementioned effects of extracting boron (B) from the ferromagnetic layer 33 realized by the non-magnetic layer 32 can be sufficiently achieved even via the annealing processing with relatively lower temperature. Thus, it is possible to improve the perpendicular magnetic anisotropy and the TMR ratio of the ferromagnetic layer 33 via the annealing processing with relatively lower temperature.

In the following, the specific effects by the aforementioned element adopted to the non-magnetic layer 31 is described.

Figure 10:
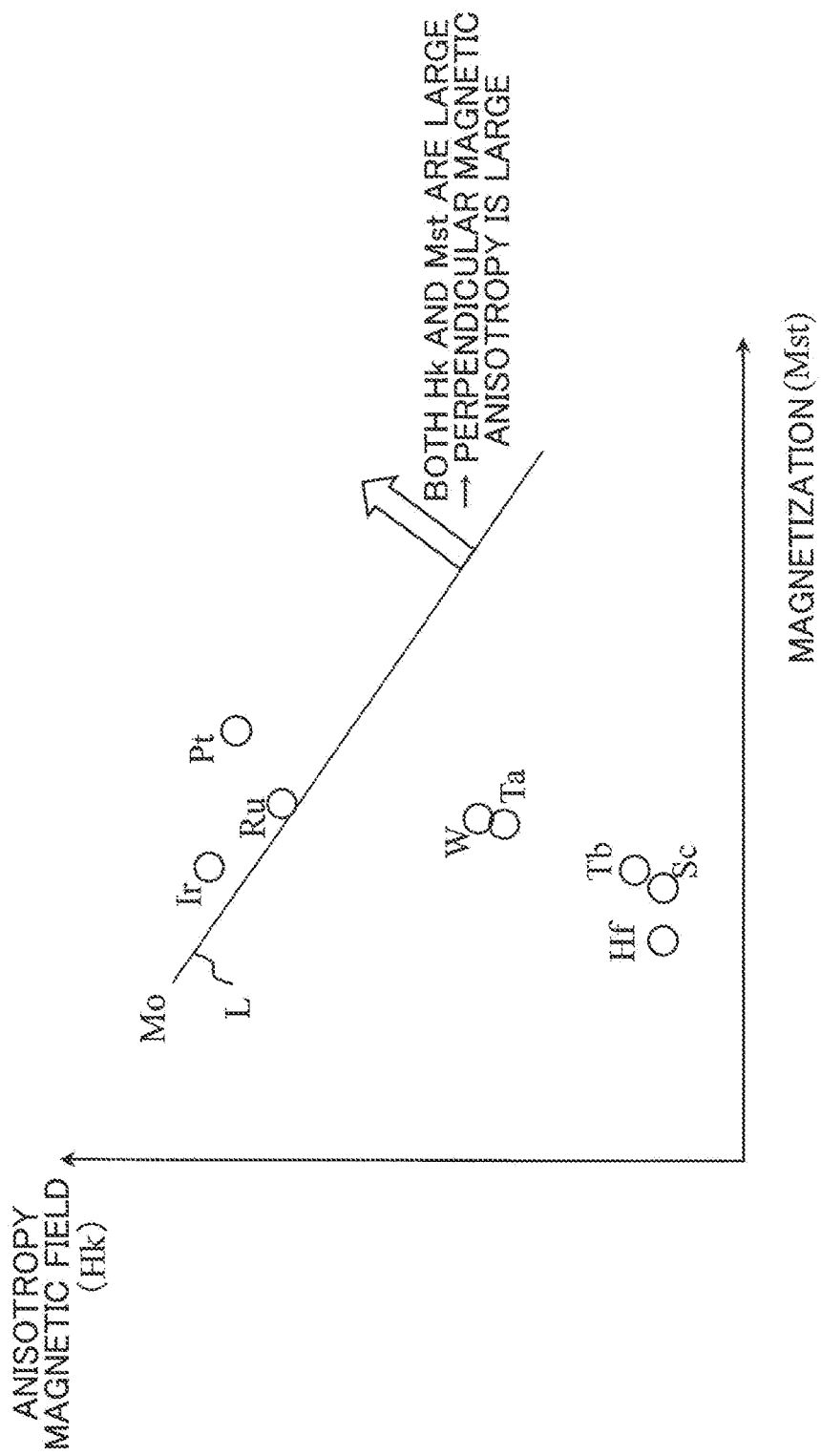
FIG. 10 is a diagram to explain a magnetic anisotropy of the magnetoresistive effect element of the magnetic storage device according to the first embodiment.

FIG. 10 is a diagram to explain the magnetic anisotropy of the magnetoresistive effect element of the magnetic storage device according to the first embodiment. FIG. 10 illustrates how the perpendicular magnetic anisotropy of the storage layer SL changes in accordance with elements included in the top layer TOP for the magnetoresistive effect element MTJ subjected to the annealing processing with relatively lower temperature (i.e., 400° C. or less).

In an example of FIG. 10, the perpendicular magnetic anisotropy is evaluated by a graph in which the abscissa axis represents magnetization Mst (a product of a saturation magnetization Ms and a film thickness t of the storage layer SL), and the ordinate axis represents anisotropy magnetic field Hk. The strength of perpendicular magnetic anisotropy may be correlated with the product of the magnetization Mst and the anisotropy magnetic field Hk, for example. Namely, in FIG. 10, a line in the graph extending from the upper left side to the lower right side may indicate a contour of the anisotropy magnetic field. Specifically, for example, the film thickness dependency of the perpendicular magnetic anisotropy of the storage layer SL in a case where molybdenum (Mo) is adopted to the top layer TOP is indicated as a line L. A case corresponding to a point in a upper right region relative to the line L indicates a case where the perpendicular magnetic anisotropy is greater than the case where molybdenum (Mo) is selected; and a case corresponding to a point in a left lower region relative to the line L indicates a case where the perpendicular magnetic anisotropy is smaller than the case where molybdenum (Mo) is selected.

As shown in FIG. 10, in each case where one of hafnium (Hf), terbium (Tb), scandium (Sc), tungsten (W), and tantalum (Ta) is selected as material adopted to the top layer TOP, the perpendicular magnetic anisotropy is significantly smaller than the case where molybdenum (Mo) is selected. In addition, in each case where one of iridium (Ir), ruthenium (Ru), and platinum (Pt) is selected as a material adopted to the top layer TOP, the perpendicular magnetic anisotropy is substantially equal to or greater than the case where molybdenum (Mo) is selected. Namely, in a case where iridium (Ir), ruthenium (Ru), platinum (Pt) or molybdenum (Mo) is included in the top layer TOP, the storage layer SL can realize the high perpendicular magnetic anisotropy even if the annealing processing with relatively lower temperature is performed.

Figure 11:
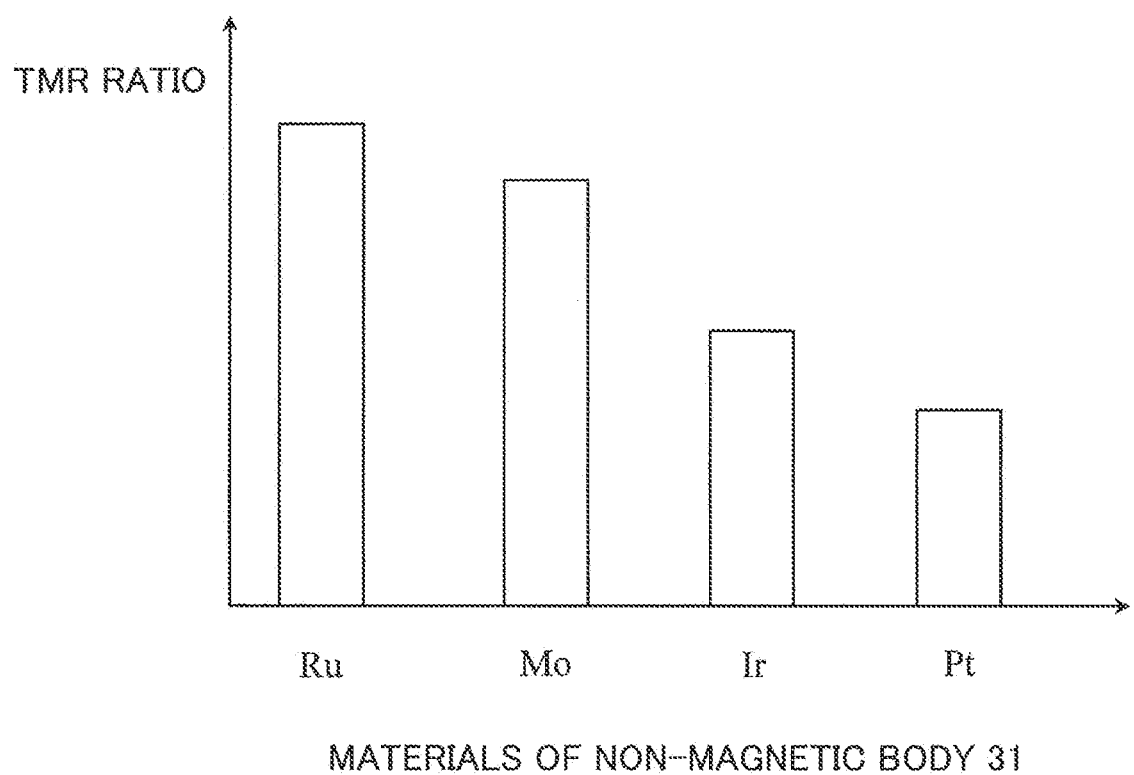
FIG. 11 is a diagram to explain a tunnel magneto resistance ratio of the magnetoresistive effect element of the magnetic storage device according to the first embodiment.

FIG. 11 is a diagram to explain a tunnel magnetoresistive ratio of the magnetoresistance effect element of the magnetic storage device according to the first embodiment. FIG. 11 illustrates the TMR ratio of the magnetoresistive effect element MTJ subjected to the annealing processing with relatively lower temperature (i.e., 400° C. or less) for the cases where each of four elements exhibiting high perpendicular magnetic anisotropy in FIG. 10 is included in the top layer TOP.

As shown in FIG. 11, in a case where molybdenum (Mo) or ruthenium (Ru) is included in the top layer TOP, the TMR ratio of the magnetoresistive effect element MTJ is significantly greater than the case where platinum (pt) or iridium (Ir) is included in the top layer TOP. Namely, in a case where ruthenium (Ru) or molybdenum (Mo) is included in the top layer TOP, the storage layer SL can realize the high TMR ratio even if the annealing processing with a relatively lower temperature is performed.

Accordingly, the non-magnetic layer 31 that includes at least one element selected from ruthenium (Ru) and molybdenum (Mo) realizes the high perpendicular magnetic anisotropy and the high TMR ratio even via the annealing processing with the temperature of 400° C. or less.

In a case where the reference layer RL and the shift cancelling layer SCL are subjected to a high temperature condition, as a result of the annealing processing with relatively higher temperature, an anti-ferromagnetic bond between the reference layer RL and the shift cancelling layer SCL may be degraded. In addition, in a case where the switching element SEL is subjected to a high temperature condition, as a result of the annealing processing with relatively higher temperature, the performance of the switching element SEL may be degraded. In the first embodiment, via the annealing processing performed within a range of relatively low temperature such as 400° C. or less, the properties of the storage layer SL can be improved, thereby suppressing the degradation of bond between the reference layer RL and the shift cancelling layer SCL or the performance of the switching element SEL.

2. Modifications

Various types of modifications are possible other than the first embodiment. In the following, some modifications applied to the first embodiment is described. Mainly the differences from the first embodiment are described for the sake of convenience.

The magnetoresistive effect element MTJ according to the first embodiment is a top-free type in which the storage layer SL is disposed above the reference layer RL; however, the magnetoresistive effect element MTJ may be a bottom-free type in which the storage layer SL is disposed below the reference layer RL.

Figure 12:
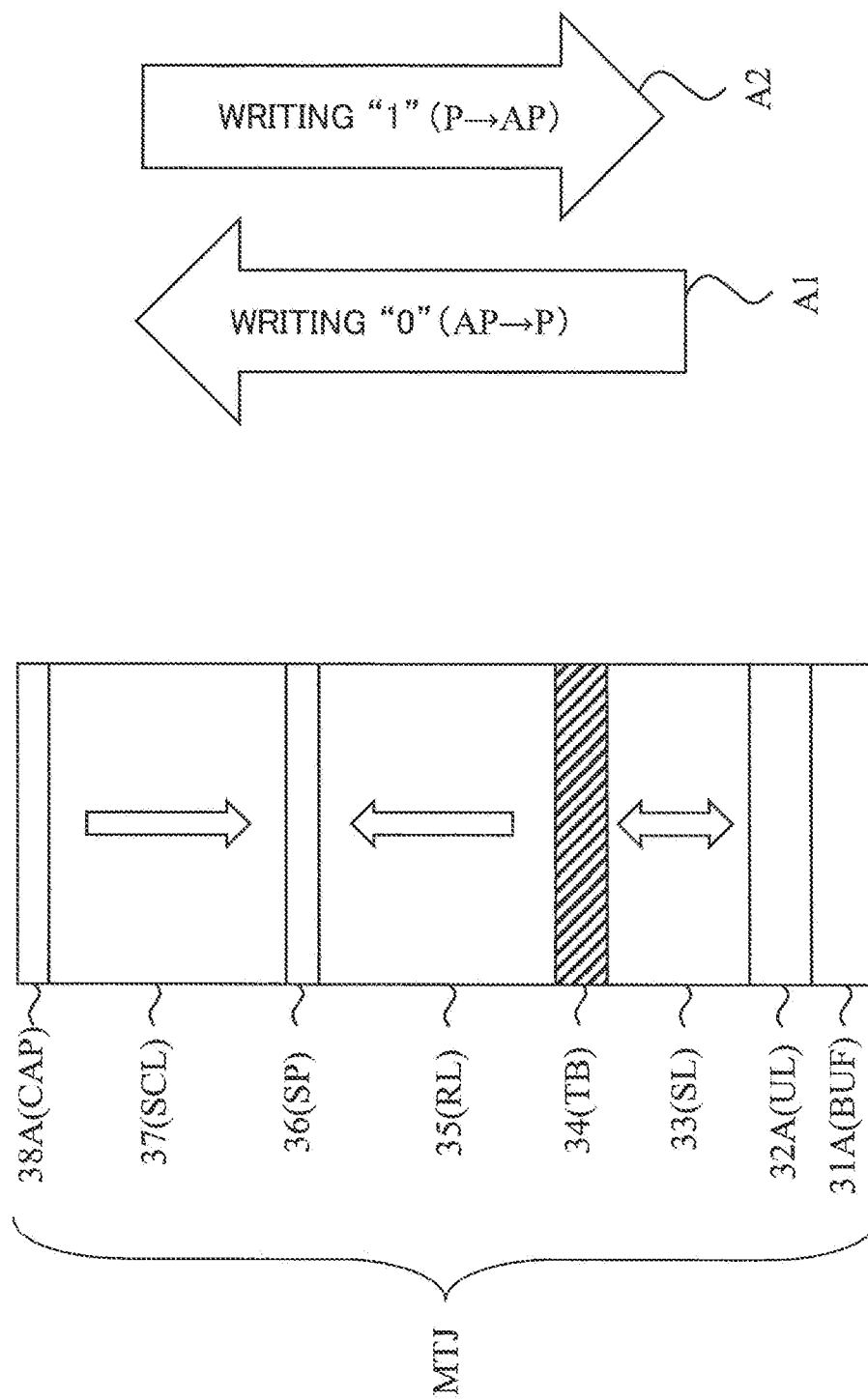
FIG. 12 is a sectional view to explain a configuration of a magnetoresistive effect element of a magnetic storage device according to a first modification.

FIG. 12 is a cross-sectional view to explain a configuration of a magnetoresistive effect element of a magnetic storage device according to a first modification. FIG. 12 illustrates the configuration of a bottom-free type magnetoresistive effect element MTJ, in comparison with the top-free type magnetoresistive effect element MTJ illustrated in FIG. 4 corresponding to the first embodiment.

In a case where the magnetoresistive effect element MTJ is formed as a bottom-free type, as shown in FIG. 12, an element 22 includes multiple materials of a non-magnetic layer 31A functioning as a buffer layer BUF, a non-magnetic layer 32A functioning as an under layer UL, a ferromagnetic layer 33 functioning as a storage layer SL, a non-magnetic layer 34 functioning as a tunnel barrier layer TB, a ferromagnetic layer 35 functioning as a reference layer RL, a non-magnetic layer 36 functioning as a spacer layer SP, a ferromagnetic layer 37 functioning as a shift cancelling layer SCL, a non-magnetic layer 38A functioning as a cap layer CAP stacked in the order given from the word line WLd side to the bit line BL side (in the Z-axis direction). An element 25 includes multiple materials of a non-magnetic layer 31A, a non-magnetic layer 32A, a ferromagnetic layer 33, a non-magnetic layer 34, a ferromagnetic layer 35, a non-magnetic layer 36, a ferromagnetic layer 37, and a non-magnetic layer 38A stacked in the order given from the bit line BL side to the word line WLu side (in the Z-axis direction).

The non-magnetic layer 31A corresponds to the non-magnetic layer 31 as explained with reference to FIG. 4 for the first embodiment, and includes a non-magnetic conductor. Specifically, the non-magnetic layer 31A includes at least one element selected from ruthenium (Ru) and molybdenum (Mo).

The non-magnetic layer 32A corresponds to the non-magnetic layer 32 as explained with reference to FIG. 4 for the first embodiment, and includes a non-magnetic conductor. Specifically, the non-magnetic layer 32A includes at least one oxide of rare-earth element selected from scandium (Sc), yttrium (Y), lanthanum (La), neodymium (Nd), samarium (Sm), europium (Eu), gadolinium (Gd), terbium (Tb), and dysprosium (Dy). The non-magnetic layer 32A may further include boron (B) and/or iron (Fe).

The non-magnetic layer 38A is a non-magnetic conductor which includes at least one element selected, for example, from platinum (Pt), tungsten (W), tantalum (Ta), and ruthenium (Ru).

For the other layers, materials, for example, equivalent to those in the first embodiment are adopted. Via the aforementioned configuration, the advantages equivalent to those of the first embodiment can be achieved even by the bottom-free type magnetoresistive effect element.

In the memory cell MC described in the first embodiment, a selector having between two terminals is adopted as the switching element SEL; however, a MOS (Metal Oxide Semiconductor) transistor may be adopted as the switching element SEL. Namely, the memory cell array is not limited to the cross-point structure, but may adopt any array structures.

FIG. 13 is a circuit diagram to explain a configuration of a memory cell array of the magnetic storage device according to a second modification. FIG. 13 corresponds to the memory cell array 10 of the magnetic storage device 1 shown in FIG. 1, according to the first embodiment.

As shown in FIG. 13, a memory cell array 10A includes a plurality of memory cells MC each associated with a set of a row and a column. Memory cells MC arranged in the same row are coupled to the same word line WL, and both ends of each of the memory cells MC arranged in the same column are coupled to the same bit line BL and the same source line/BL.

FIG. 14 is a cross-sectional view to explain a configuration of the memory cell of the magnetic storage device according to the second modification. FIG. 14 corresponds to the memory cell MC described with reference to FIG. 3, according to the first embodiment. In an example shown in FIG. 14, the memory cell MC is not stacked onto the semiconductor substrate, and accordingly an additional symbol, "u" or "d", etc. is not added.

As shown in FIG. 14, the memory cell MC is provided above the semiconductor substrate 40, and includes a selection transistor 41 (Tr) and a magnetoresistive effect element 42 (MTJ). The selection transistor 41 is disposed as a switch for controlling supplying and stopping a current at the time of writing and reading data relative to the magnetoresistive effect element 42. The configuration of the magnetoresistive effect element 42 is equivalent to the configuration shown in FIG. 4 according to the first embodiment, or in FIG. 12 according to the first modification.

The selection transistor 41 includes a gate (conductor 43) functioning as a word line WL, and a pair of regions (a source region and a drain region) (diffusion regions 44) disposed on the semiconductor substrate 40 at both ends along the X-direction of the gate. The conductor 43 is disposed on an insulator 45 functioning as a gate insulation film disposed on the semiconductor substrate 40. The conductor 43 extends, for example, along the Y-direction, and is commonly coupled to a gate of a selection transistor (not illustrated) of each of the other memory cells MC arranged along the Y-direction. The conductors 43 are arranged, for example, in the X-direction. A contact 46 is disposed on one of the diffusion regions 44 disposed at a first end of the selection transistor 41. The contact 46 is coupled on the lower surface (first end) of the magnetoresistive effect element 42. A contact 47 is disposed on the upper surface (second end) of the magnetoresistive effect element 42, and a conductor 48 functioning as a bit line BL is coupled on the upper surface of the contact 47. The conductor 48 extends, for example, along the X-direction, and is commonly coupled to the second end of the magnetoresistive effect element (not illustrated) of each of the other memory cells arranged in the X-direction. A contact 49 is disposed on the other of the diffusion regions 44 disposed at a second end of the selection transistor 41. The contact 49 is coupled on the lower surface of the conductor 50 functioning as a source line/BL. The conductor 50 extends, for example, along the X-direction, and is commonly coupled to the second end of a selection transistor (not illustrated) of each of the other memory cells MC arranged along the X-direction. The conductors 48 and 50 are arranged, for example, in the Y-direction. The conductor 48 is, for example, placed above the conductor 50. Although not illustrated in FIG. 15, the conductors 48 and 50 are arranged to avoid physical and electrical interference. The selection transistor 41, the magnetoresistive effect element 42, the conductors 43, 48, and 50, and the contacts 46, 47, and 49 are covered with an interlayer insulation film 51. The other magnetoresistive effect elements (not illustrated) arranged along the X-direction or the Y-direction relative to the magnetoresistive effect element 42 are disposed, for example, on the same layer level. Namely, a plurality of magnetoresistive effect elements 42 are arranged, for example, on the XY plane within the memory cell array 10A.

Via the above configuration, the advantageous effects equivalent to the first embodiment can be accomplished in the case where a MOS transistor that is a switch between three terminals is adopted as the switching element SEL, instead of a switch between two terminals.

In the memory cell MC described in the aforementioned embodiment and modifications, the magnetoresistive effect element MTJ is disposed below the switching element SEL; however, the magnetoresistive effect element MTJ may be disposed above the switching element SEL.

Furthermore, in the first embodiment and the modifications, the magnetic storage device that includes an MTJ element is described as an example of the magnetic storage device that includes a magnetoresistive effect element; however, the magnetic storage device is not limited thereto. For example, the magnetic storage device includes other devices which require a magnetic element having perpendicular magnetic anisotropy such as a sensor, media, etc.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic storage device comprising:
a magnetoresistive effect element;
the magnetoresistive effect element including:
   a first ferromagnetic layer;
   a second ferromagnetic layer;
   a non-magnetic layer between the first ferromagnetic layer and the second ferromagnetic layer; and
   a first layer provided at a side of the first ferromagnetic layer opposite to a side of the first ferromagnetic layer at which the non-magnetic layer is provided,
wherein:
the first layer includes a rare-earth element; and
the first layer has a region including boron (B) at a proportion higher than a proportion of boron (B) in the first ferromagnetic layer.

2. The device of claim 1, further comprising:
a second layer provided at a side of the first layer opposite to a side of the first layer at which the first ferromagnetic layer is provided.

3. The device of claim 2, wherein:
the second layer includes one of ruthenium (Ru) and molybdenum (Mo).

4. The device of claim 1, wherein:
the first layer includes oxygen (O).

5. The device of claim 1, wherein:
the non-magnetic layer has a region including oxygen (O) at a proportion higher than a proportion of oxygen (O) in the first layer.

6. The device of claim 2, wherein:
the second layer includes one of iridium (Ir) and platinum (Pt).

7. The device of claim 2, wherein:
the second layer includes at least one element selected from boron (B), silicon (Si), and carbon (C).

8. The device of claim 2, wherein:
the second layer has an amorphous structure.

9. The device of claim 2, wherein:
the second layer is in contact with the first layer.

10. The device of claim 1, wherein:
the first layer further includes iron (Fe).

11. A magnetic storage device comprising:
a magnetoresistive effect element;
the magnetoresistive effect element including:
   a first ferromagnetic layer;
   a second ferromagnetic layer;
   a non-magnetic layer between the first ferromagnetic layer and the second ferromagnetic layer; and
   a first layer provided at a side of the first ferromagnetic layer opposite to a side of the first ferromagnetic layer at which the non-magnetic layer is provided,
wherein:
the first layer includes a rare-earth element;
the first layer has a region in which a first strength corresponding to boron (B) is higher than a second strength corresponding to boron (B) in the first ferromagnetic layer; and
the first strength and the second strength are determined based on electron energy loss spectroscopy (EELS).

12. The device of claim 11, further comprising:
a second layer provided at a side of the first layer opposite to a side of the first layer at which the first ferromagnetic layer is provided.

13. The device of claim 12, wherein:
the second layer includes one of ruthenium (Ru) and molybdenum (Mo).

14. The device of claim 11, wherein:
the first layer includes oxygen (O).

15. The device of claim 11, wherein:
the non-magnetic layer has a region in which a third strength corresponding to oxygen (O) is higher than a fourth strength corresponding to oxygen (O) in the first layer; and
the third strength and the fourth strength are determined based on the EELS.

16. The device of claim 12, wherein:
the second layer includes one of iridium (Ir) and platinum (Pt).

17. The device of claim 12, wherein:
the second layer includes at least one element selected from boron (B), silicon (Si), and carbon (C).

18. The device of claim 12, wherein:
the second layer has an amorphous structure.

19. The device of claim 12, wherein:
the second layer is in contact with the first layer.

20. The device of claim 11, wherein:
the first layer further includes iron (Fe).

* * * * *